United States Patent [19]

McKinley, Jr.

[11] Patent Number: 4,479,240
[45] Date of Patent: Oct. 23, 1984

[54] AUDIO MIXING CONSOLE WITH CONTROL ELEMENT POSITION STORAGE

[76] Inventor: Robert H. McKinley, Jr., 467 W. 38th St., Houston, Tex. 77018

[21] Appl. No.: 306,689

[22] Filed: Sep. 29, 1981

[51] Int. Cl.$^3$ .......................... H04B 3/00; H04B 1/00
[52] U.S. Cl. ....................................... 381/80; 381/98; 381/109; 381/118; 381/119
[58] Field of Search ................. 179/1 B, 1 CN, 1 AT, 179/1 MN; 84/1.24; 360/13, 69, 79; 369/4; 364/514; 381/118, 119, 58, 80, 81, 82-85, 98, 101-105, 109, 107, 108

[56] References Cited

U.S. PATENT DOCUMENTS

| | | | |
|---|---|---|---|
| 3,932,886 | 1/1976 | Olms et al. | 360/13 |
| 3,935,781 | 2/1976 | Katoh et al. | 84/1.11 |
| 4,129,055 | 12/1978 | Whittington et al. | 84/1.01 |
| 4,185,531 | 1/1980 | Oberheim et al. | 84/1.24 X |
| 4,187,544 | 2/1980 | Larner | 364/514 |
| 4,244,260 | 1/1981 | Kniepkamp et al. | 84/1.21 |
| 4,292,467 | 9/1981 | Olden et al. | 179/10 |

OTHER PUBLICATIONS

Advertising Publication by Solid State Logic re Total Recall System for Mixing Consoles, date of publication unknown.
Advertising Publication by MCI re JH-652 Mixing Console, date of publication unknown, copyrighted 1980.
Adversiting Publication by Harrison Systems, Inc. re MR-Z Mixing Console, date of publication unknown.

Primary Examiner—Gene Z. Rubinson
Assistant Examiner—W. J. Brady
Attorney, Agent, or Firm—David S. Wise

[57] ABSTRACT

A sound reproduction system with an improved audio mixing console provides means for instantaneous recordation of the positions of control elements on modules of the mixing console. Means are also provided for recalling the recorded positions and indicating to the sound engineer the recorded positions by use of a pair of light-emitting diodes adjacent to each control element on the console.

19 Claims, 5 Drawing Figures

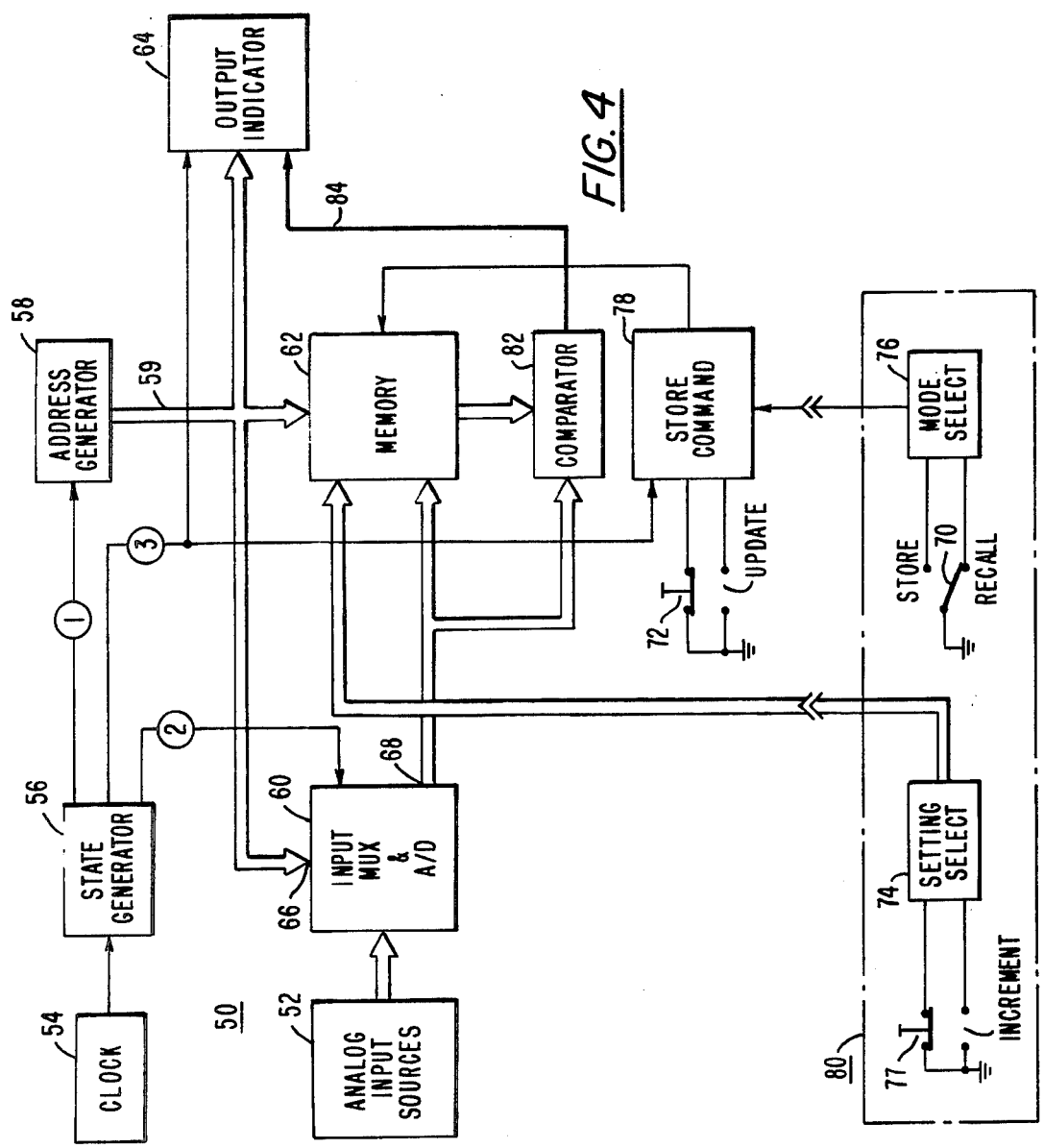
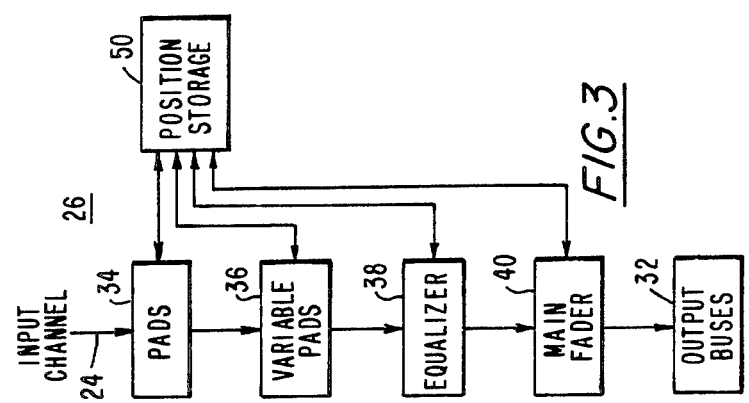

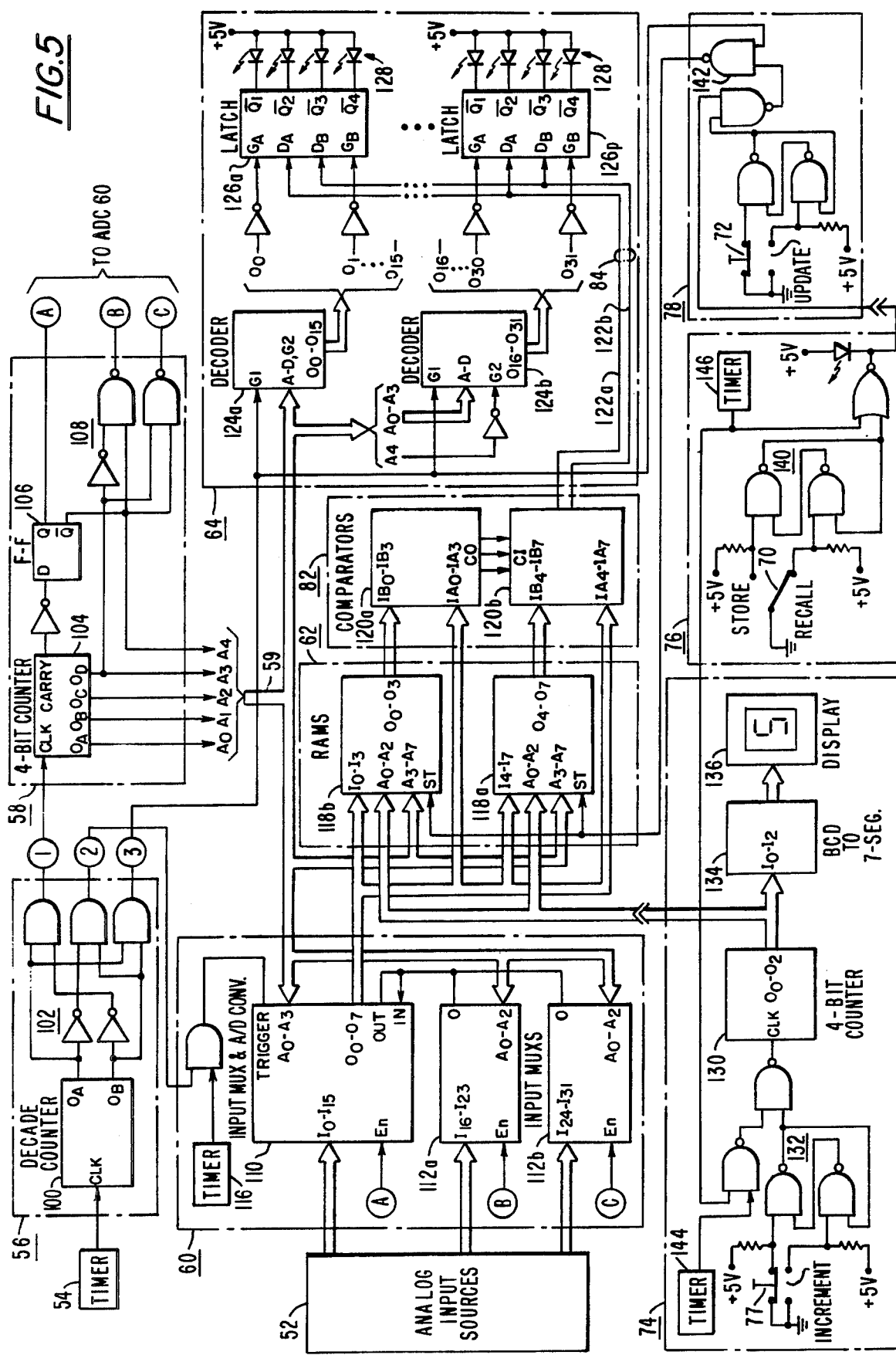

AUDIO MIXING CONSOLE WITH CONTROL ELEMENT POSITION STORAGE

BACKGROUND OF THE INVENTION

This invention relates to the field of audio engineering and more particularly to an improved audio mixing console.

An audio mixing console is an electronic apparatus having a plurality of audio input signals, denoted input channels, and producing a plurality of audio output signals, denoted output channels, the number of output channels being generally fewer than the number of input channels. Each mixing console comprises a plurality of input and output modules, each module corresponding to a single input or output channel. The output signals from one or more input modules may be combined at an output module to form a single audio output channel from the console.

Typical applications for a mixing console include sound production at a concert and sound recording at a recording studio. Two types of mixing consoles are used at a concert: one to mix the house sound broadcast to the audience, and one to mix the monitor sound broadcast through monitor speakers to musicians. In all cases, the input channels on the mixing console are connected to a microphone or a musical instrument. At the mixing console the input signals are processed according to the command of a sound engineer and passed to the output channels for appropriate use. In the case of a concert, the audio signal derived from an output channel ultimately passes to an amplifier which drives speakers, broadcasting the audio signals to an audience or to the musicians. In the case of a recording studio, the audio signal typically passes to a tape recorder.

Each input and output module on the console comprises independent electronics for processing the associated signals. Typical signal processing includes filtering, attenuation and amplification of the signal, as determined by a series of control elements, such as potentiometers and switches, to obtain desirable output signals. By skillful use of a mixing console, a sound engineer, for example, eliminates undesirable noise components, makes tone adjustments and adjusts the level of each input signal to obtain output signals which combine at the ear of a listener, when broadcast through speakers, to produce a balanced, satisfying sound.

Problems which can arise with the use of typical prior art mixing consoles are best demonstrated by a description in greater detail of a process for utilizing an audio mixing console. Large mixing consoles are frequently employed as the central feature in a sound reproduction system for the house sound at a concert presented by one or more groups of musicians. Mixing consoles are also employed to mix the monitor sound at a concert. Mixing consoles utilized in a sound reproduction system at a concert must be readily transportable and hence are distinct from mixing consoles found as permanent fixtures in a recording studio. A typical sound reproduction system for the house sound, in general terms, comprises input devices, a mixing console, external processing equipment, amplifiers, and speakers. Similarly, a sound reproduction system for the monitor sound, in general terms, comprises the same input devices used in the house sound system, a mixing console, external processing equipment, amplifiers, and monitor speakers.

The input devices are generally located on a stage with the musicians. In most cases, the input devices comprise microphones positioned adjacent to musical instruments so as to detect the sounds emanating therefrom, or microphones arranged for voice pick-up from vocalists. In some cases the input devices comprise direct electrical connections to certain musical instruments, such as electric guitars. In all cases each input device is connected via electric cable to an independent input channel on the mixing console.

The large mixing console for the house sound may typically provide twelve or more individual output signals, each of which corresponds to a single output module of the console. Some or all of these output signals may pass through external processing equipment, such as an echo device, a reverberation device, or a digital delay device, which provides special effects to the output signals.

From any external processing equipment which may be used in the system or, if none, from the output of the mixing console, the output signals are directed by electric cable to amplifiers, which are generally positioned on the stage immediately behind the speakers. The amplifiers drive the large speakers which broadcast the music to the audience or the musicians. Typically, the speakers for the house sound are arranged in two stacks, one stack on each side of the stage, although a variety of other speaker arrangements are often used in conjunction with the two stacks. The musicians are generally positioned on the stage between and behind the two speaker stacks. Monitor speakers are arranged in any configuration necesssary to ensure that each musician can hear his own voice or instrument.

The large mixing console itself can typically be a very complex electronic apparatus, the complexity arising primarily from the great number of adjustable electronic control elements found thereon. These control elements may comprise switches, buttons, dials, or any other electronic control elements. A typical module of the mixing console may comprise in excess of thirty-two such control elements, and the large mixing console for the house sound may easily comprise in excess of thirty such modules. Hence, the sound engineer on the house mixing console may have more than 960 distinct control elements which must be adjusted to obtain the desired output signals. The monitor mixing console, although typically having fewer modules than the house mixing console, also comprises a large number of distinct control elements which must be adjusted.

Typical musical concerts often have two or more musical groups scheduled to perform consecutively. In the afternoon prior to an evening performance, each group appears on the stage for a sound check, usually in the reverse order of the evening performance. The sound check procedure enables sound technicians, including the sound engineers positioned at the mixing consoles, to preset the sound equipment, particularly the many control elements on the mixing consoles, for the performance that evening. Any given arrangement of control element positions for a single group is denoted a console setup. During the sound check procedure, the sound engineers must determine a console setup for each group performing that evening.

After the control elements on the consoles have been adjusted for the first group at the sound check, the position of the many control elements must be recorded in some fashion for later recall at the time of performance. Recordation of a console setup sometimes takes the form of a piece of tape at each control element on the consoles with an appropriate mark on each piece of tape indicating the desired position. Other times one of the sound technicians must record each position on a handwritten chart or with a portable tape recorder. In both cases, the object of the recordation process is to enable the sound engineer to recall as quickly and easily as possible the optimum control element positions determined during the sound check.

The lack of a quick and efficient means for recording the control element positions renders both the sound check and the actual performance setup a time-consuming, cumbersome process. As the number of groups performing at a single concert increases, the task of recordation becomes a greater burden. It should also be evident that the present system of recordation is prone to a substantial number of errors, which translate into a poorer quality concert.

Hence, the known prior art audio mixing consoles designed for use outside of a recording studio do not provide adequate means for recordation and subsequent recall of the positions of control elements on the mixing console.

SUMMARY OF THE INVENTION

Accordingly, a sound reproduction system including an improved audio mixing console is provided. The improved mixing console comprises a plurality of input modules, a plurality of output modules, switching means for connecting input modules to output modules, and means for effecting substantially instantaneous recordation and subsequent recall of the position of control elements on the input and output modules. Means are provided for electronically recording a plurality of console setups for each control element. Mixing console modules are constructed with a pair of light-emitting diodes (LEDs) adjacent to each control element on the module. The lighting of one or the other LED indicates to a sound engineer that the adjacent control element is out of position and also indicates the direction of movement necessary to achieve the recorded position. When both LEDs associated with a given control element are off, the recorded position has been achieved.

BRIEF DESCRIPTION OF THE DRAWINGS

FIG. 3 shows a generalized block diagram of a single module from the audio mixing console of FIG. 2, the module being arranged according to the principles of the invention.

FIG. 4 shows a generalized block diagram of a position storage device which is depicted in FIG. 3.

FIG. 5 shows a schematic diagram of the position storage device depicted in FIG. 4.

DESCRIPTION OF THE PREFERRED EMBODIMENT

Figure 1:
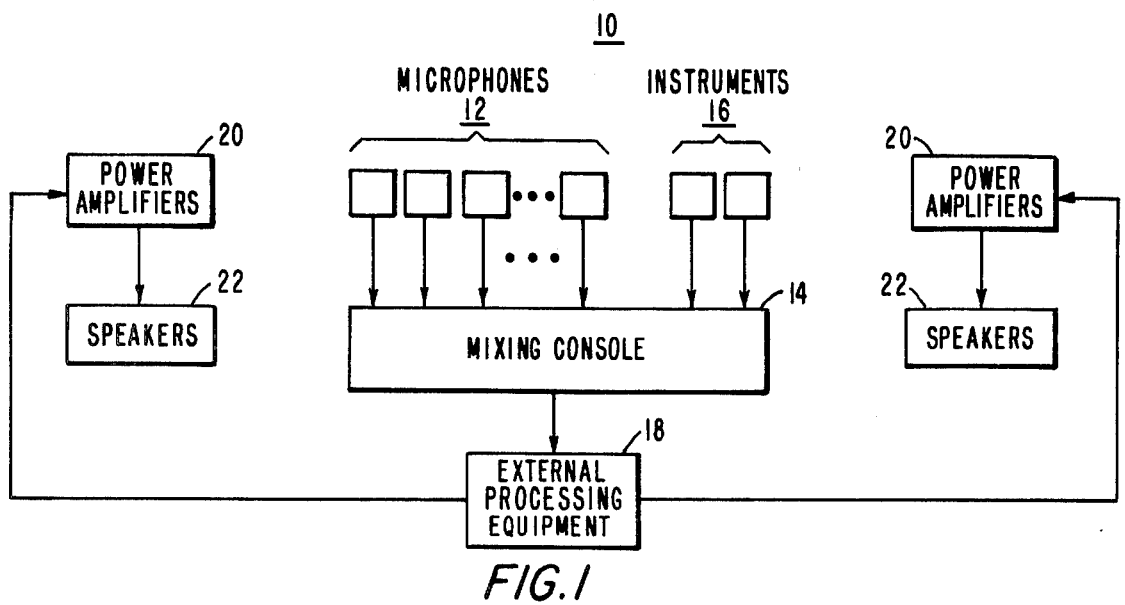
FIG. 1 shows a block diagram of a sound reproduction system including an improved audio mixing console.

More particularly, there is shown in FIG. 1 a block diagram of a sound reproduction system 10 for a concert. Music, or sound, originates with musicians on a stage (not shown). In most cases the sound is transformed into electrical signals by means of microphones 12 positioned on the stage. Thereafter the electrical signals are communicated to an input channel on a house mixing console 14. In other cases, direct instrument hookups communicate electrical signals directly from instruments 16 to an input channel on the mixing console 14.

The mixing console 14, described in greater detail below, receives a plurality of input signals, each of which is assigned to a distinct input channel and corresponding input module, and provides a plurality of output signals, each of which is derived from an output channel and corresponding output module. Output channels from the mixing console 14 are connected to external processing equipment 18, such as reverberation devices, echo devices, and digital delay devices, which may be used to provide special effects. External processing equipment 18 may also comprise equalizers, compressors, and cross-over networks. Output signals from the external processing equipment 18 are connected to power amplifiers 20. The power amplifiers 20 drive speakers 22 which are typically arranged in close proximity to the amplifiers 20 in order to minimize the length of cable therebetween. In a typical arrangement for the house sound, the speakers 22 may be positioned on opposite sides of the stage with amplifiers 20 positioned behind the speakers 22.

A sound reproduction system for monitor sound (not shown) is typically arranged in the same fashion as that shown for house sound, utilizing the same microphones 12 and instrument hookups as the house system, but having distinct a mixing console, external processing equipment, amplifiers and speakers. The monitor amplifiers are arranged on a convenient side of the stage to drive speakers which broadcast sound to the musicians.

Figure 2:
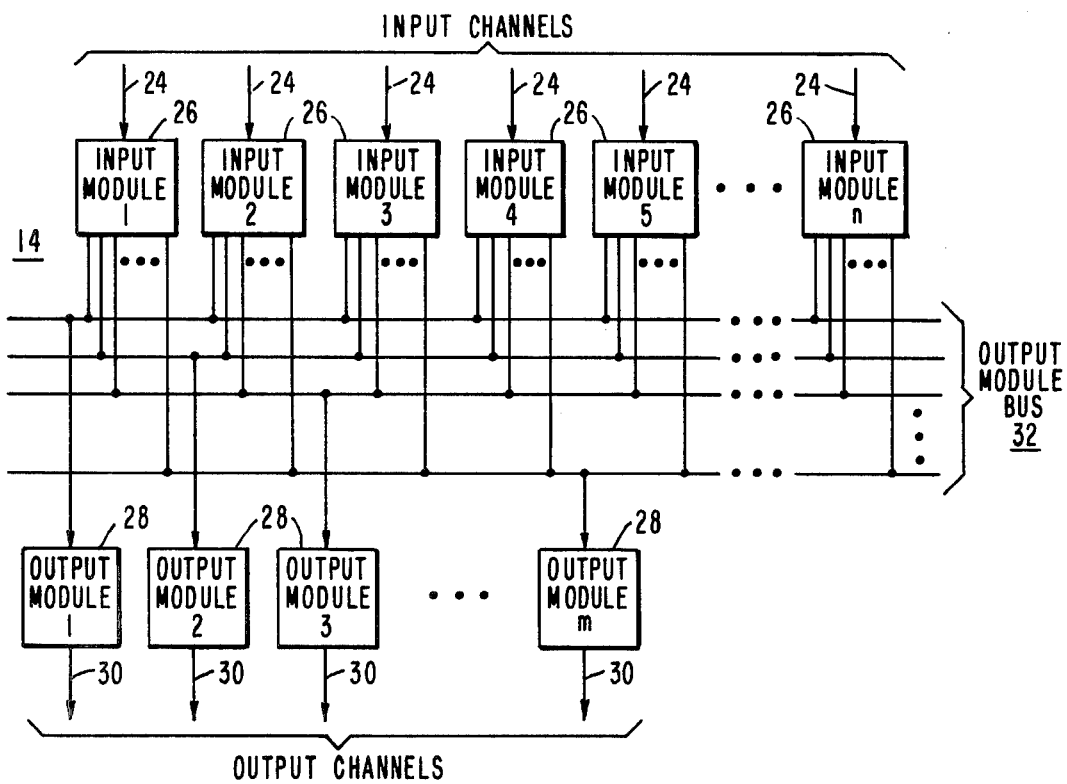
FIG. 2 shows a generalized block diagram of the audio mixing console depicted in FIG. 1.

FIG. 2 shows a generalized block diagram of the mixing console 14 of FIG. 1. A monitor mixing console is typically arranged in similar fashion to the mixing console 14. Distinctions will be noted below as they arise. The input signals derived from microphones and direct instrument hookups are communicated to the mixing console along input channels 24, each of which corresponds to an independent input module 26. A single mixing console 14 comprises a plurality of input modules 26. A mixing console 14 arranged according to the principles of the invention may comprise any number of input modules 26. The mixing console 14 further comprises a plurality of output modules 28, each of which is associated with a corresponding output channel 30. Each output module 28 is internally connected to an independent bus 32. Each input module 26 is internally connected to each of the output module buses 32. Control elements (not shown) on each input module 26 permit selective connection of an input module 26 to any output module 28, or group of output modules 28. In the case of the monitor mixing console, control elements on each input module 26 permit selective adjustment of the signal amplitude passed to each output module 28 on the console.

An input module 26 such as is depicted in FIG. 2 is shown in greater detail in FIG. 3. Each input module 26 comprises a variety of signal processing apparatus arranged in serial fashion. It should be noted that a typical output module 28 comprises apparatus substantially the same as apparatus comprising an input module 26. Typical signal processing apparatus which may be included in the input module 26 comprises pads 34, variable pads 36, an equalizer 38, and a main fader 40. Pads 34 are electronic apparatus for providing fixed input signal attenuation. Control elements for pads 34 typically comprise a multiple-position switch providing variable amounts of fixed signal attenuation.

From the pads 34 an input signal passes to the variable pads 36, also called the gain set or the input attenuator. The variable pads 36 typically comprise apparatus for amplifying or attenuating the incoming signal, the control element therefor being a single potentiometer.

The third section 38 of the module 26 may comprise apparatus for equalizing the input signal. This equalization section 38 may be divided into several subsections, each of which typically corresponds to an individual parametric equalizer. A parametric equalizer is an equalizer with certain characteristics determinable by control elements. Typically, the center frequency, the bandwidth, and the gain of each subsection of the equalizer may be adjusted. Each of the several parametric equalizer subsections comprises a control element, such as a potentiometer, for each adjustable characteristic. The equalizer section 38 may further comprise a low-pass filter and a high-pass filter.

From the equalization section 38 the signal passes to a main fader 40 which may comprise apparatus for attenuating the signal before it passes to the output module buses 32. The control element for the main fader 40 is generally a slide potentiometer.

As shown in FIG. 3 each processing section of the module 26 is connected to a position storage device 50, which provides for recordation and subsequent recall of the positions of the control elements in each of the modules 26, 28 processing sections.

A block diagram of the position storage device 50 is depicted in FIG. 4. By the use of specially arranged control elements (not shown), such as multiple-wiper potentiometers or multiple-pole switches, the position of each control element is coded in an analog voltage signal in the range of 0 to 5 volts DC. This method of cooling control element position does not interfere with normal signal processing carried out by the module 26. The analog input voltages are represented at an analog input sources block 52. In accordance with the principles of the invention, a position storage device 50 comprises a clock 54 which increments a counter within a three-state generator 56.

The first state of the state generator clocks an address generator 58. The address generator 58 counts sequentially through a predetermined set of addresses, the number of said addresses corresponding to the number of analog input signals derived from control elements on the given module 26. Each address generated thereby is provided on an address bus 59 to three points within the position storage device 50: an input multiplexer and analog-to-digital converter device (ADC) 60, a memory 62, and an output indicator device 64.

The second state of the state generator 56 triggers an input signal load and analog-to-digital conversion cycle of the ADC 60. Hence, once an address has been placed on an address port 66 of the ADC 60, the trigger signal causes the addressed analog signal to be loaded into the ADC 60 and converted to digital form. The resultant digitized signal is available at an output port 68 of the ADC 60.

The third state of the state generator 56 serves two functions. First, it triggers the output indicator device 64 to update a control element position display (not shown). Second, it causes the recently digitized input signal from the ADC 60 to be stored in the addressed memory location in the memory 62 when one of two conditions is met: a mode select switch 70, associated with a mode select device 76, is placed in the "store" position; or a store command button 72, associated with a store command device 78, is depressed.

A setting select device 74 provides several additional memory address bits, for example three additional bits, to enable the position storage device 50 to store a plurality, for example eight, of console setups at any one time. A single-pole increment switch 77 associated with the setting select device 74 provides the capability of switching among the different console setups. Thus, each module 26 may be arranged for the performance of several different groups of musicians and the console setup for each group may be recorded by the position storage device 50. The setting select device 74 and the mode select device 76 comprise a single unit 80 connected to each module 26, 28 of the mixing console 14. All other electronic devices comprising the position storage device 50 and depicted in FIG. 4 are common to each module 26, 28.

At all times when the position storage device 50 is operational, a magnitude comparator 82 compares the digitized voltage signal appearing at the output port 68 of the ADC 60 with the digitized voltage for that same signal stored in the memory 62, and generates a signal on one of two output signal lines 84. If the magnitude of the recently digitized input signal exceeds the magnitude of the stored digitized signal, a first output line is active and a second output line is inactive. Alternatively, if the magnitude of the stored digitized signal exceeds the magnitude of the recently digitized signal, the first output line is inactive and the second output line is active. If the two magnitudes are substantially equivalent, both the first and the second output lines are inactive. The tolerance within which the two magnitudes are deemed equivalent may be adjusted by appropriate arrangement of the magnitude comparator 82.

The output indicator device 64 comprises a pair of light-emitting diodes (LEDs) (not shown) associated with each control element on the module 26 and apparatus for support thereof. The third state of the state generator 56 triggers an update of the two LEDs associated with the control element which corresponds to the address on the address bus 59 at that point in time. The two output lines 84 from the magnitude comparator 82 provide the source of the update information channeled to the appropriate LEDs. Thus, the output indicator device 64 provides a constant display of the results of the comparison between the magnitudes of the input analog voltages and the voltage magnitudes stored in memory for each control element. The display, in the form of the two LEDs adjacent to each control element, enables the sound engineer to relocate previously recorded control element positions.

To use the position storage function of the improved audio mixing console 14, the sound engineer first makes the desired adjustments to control elements on each module 26, 28 of the mixing console 14. Next, the sound engineer chooses the desired console setup number by use of the increment switch 77 at the setting select device 74. The position of each control element on each module 26, 28 of the mixing console 14 may then be stored by placing the mode select switch 70 in the "store" position. When the mode select switch 70 is returned to the "recall" position, all LEDs of the output indicator device 64 should be off. Additional mixing console setups may be recorded by repeating the above procedure. The sound engineer may also record a new control element setting for each control element on a single module 26, 28 without disturbing the setup recorded for the other modules 26, 28 by depressing the store command button 72 associated with that module.

To later recall a previously recorded console setup, the sound engineer selects the appropriate setting number by use of the increment switch 77. When the proper setting number is selected, the LEDs of the output indicator device 64 will indicate which control elements need to be adjusted to obtain the previously recorded setup. If a given control element is set too low, for example, a green LED associated with that control element will be lighted. If the control element is set too high, for example, a red LED associated with that control element will be lighted. When both LEDs are off, the position of the control element corresponds to the recorded position. Hence, the sound engineer may quickly and accurately reset the mixing console to a previously recorded state.

FIG. 5 shows a detailed schematic diagram for the position storage device 50 depicted in block diagram form in FIG. 4. The preferred embodiment shown in FIG. 5 comprises a hardware implementation in transistor-transistor logic (TTL) format. TTL devices utilize a signal level of either 0 volts DC or 5 volts DC. All hardware elements depicted in FIG. 5 are connected to a 5 volt DC power supply. A majority of the integrated circuits utilized are 7400 Series devices, manufactured by many different manufacturers and well known in the art.

It is also anticipated that the block diagram shown in FIG. 4 could be implemented by a microcomputer. The disclosure of hardware and the operational description herein provide sufficient background to enable design of a software and hardware system for such a microcomputer embodiment.

The clock 54 is implemented by a timer device, such as a 555 timer. The timer device 54 drives the state generator 56, which comprises a decade counter 100, such as a 7490. The decade counter 100 is arranged to count through four states. Logicial devices 102 connected to the output of the decade counter 100 decode the last three of the four states as state 1, state 2 and state 3.

State 1 clocks a four-bit counter 104, such as a 74193, in the address generator 58. The four-bit counter 104 in combination with a flip-flop 106, such as a 7476, generates a five-bit address ($A_0$–$A_4$) on an address bus 59. Logical devices 108 connected to the output of the flip-flop 106 decode enable signals for analog multiplexer devices in the ADC 60.

The four least significant bits ($A_0$–$A_3$) of the five-bit address on the address bus 59 are connected to an analog input multiplexer and eight-bit analog-to-digital converter device (IADC) 110, such as an ADC 0817, manufactured by National Semiconductor Corp. and described generally in the *Data Acquisition Handbook* published in 1978 by National Semiconductor. The three least significant bits ($A_0$–$A_2$) of the five-bit address are connected to each of two additional analog multiplexer devices 112, such as two 4051 devices, manufactured by National Semiconductor Corp. and described generally in the *SMOS Databook* published in 1978 by National Semiconductor. The combination of these three devices comprises the ADC 60. The IADC 110 receives as input signals a maximum of sixteen discrete analog signals ranging in voltage from 0 to 5 volts. The two additional analog multiplexer devices 112 each receive a maximum of eight discrete analog voltage signals. The three multiplexer devices are selectively enabled by the enable signals provided from the address generator 58 so as to multiplex thirty-two analog signals into the analog-to-digital converter within the IADC 110.

State 2 of the state generator 56 enables a trigger signal generated by a timer device 116, such as a 555 timer, which trigger signal causes an input analog voltage signal selected by the previously determined address to be loaded into the analog-to-digital converter within the IADC 110 and thereafter digitized.

All five bits of the address bus 59 are connected to two random access memories (RAMS) 118, such as two 2101 devices, manufactured by National Semiconductor Corp. and described generally in the *Memory Databook* published in 1978 by National Semiconductor, which comprise the memory 62. Three additional address bits are generated by the setting select device 74. When enabled by the store command device 78, the eight-bit digitized analog voltage signal from the ADC 60 is stored in the two random access memories 118, four bits in each device.

The digitized analog voltage signal from the ADC 60 is also provided as an input to the magnitude comparator 82 which comprises two four-bit magnitude comparators 120, such as two 7485 devices. The magnitude comparators 120 constantly compare the recently digitized analog signal from the ADC 60 with the digitized signal stored in the memory 62 and provide an output signal on one of two or none of two signal lines 122.

The five-bit address bus 59 is also connected to a pair of four-line to sixteen-line decoders 124, such as two 74154 devices, comprising the output indicator device 64. The decoders 124 decode the five-bit address to selectively enable two of sixty-four latches 126, such as a 7475. The two output signal lines 122 from the magnitude comparator 82 set or reset the enabled latches 126. LEDs 128, each connected to an output of one latch 126, are thereby lighted or turned off, indicating the results of the comparison in the magnitude comparator 82.

The setting select device 74 comprises a four-bit counter 130, such as a 74193, arranged to count through eight states. The counter 130 is clocked by the increment switch 77 through logical devices 132 arranged to debounce the switch 77. The three least significant output bits from the counter 130 provide the three-bit address extension to the memory 62. The three output bits from the counter 130 are decoded by a binary-coded decimal to seven-segment driver 134, such as a 7447, which is connected to a seven-segment display 136. The display 134 indicates to the sound engineer which of eight possible console setups is currently being used.

The mode select device 76 comprises the two-pole mode select switch 70 and logical devices 140 for debouncing that switch 70. When the mode select switch 70 is placed in the "store" position, the third state of the state generator 58 is enabled at a logical gate 142 and passes to the memory module where it causes the digitized analog signals to be stored.

A timer device 144, such as a 555 timer, associated with the setting select device 74 and a timer device 146, such as a 555 timer, associated with the mode select device 76 are arranged to initialize the position storage device 50 when power is first turned on. The timers 144, 146 cycle the memory 62 through each of thirty-two eight-bit storage locations for all eight console setups, storing the current position of each control element.

This procedure prevents a large current drain and consequent power supply overload which would otherwise occur when random values stored in memory on power-up cause large numbers of LEDs on the console to be lighted.

Although not revealed by the drawings, the improved audio mixing console is preferably constructed with an autonomous power source, such as a battery, arranged to apply power to the position storage device 50 when AC power is lost or unavailable, as in transportation of the mixing console. Such an arrangement ensures the integrity of data stored in the memory 62.

What is claimed is:

1. A portable audio mixing console having a plurality of signal inputs and a plurality of signal outputs, and comprising:
   a plurality of input modules having connected thereto a plurality of control elements, each of said input modules corresponding to a signal input and comprising apparatus for processing electrical signals from said signal input, the processing including adjustments to the signal input by use of the control elements connected to the input module;
   a plurality of output modules having connected thereto a plurality of control elements, each of said output modules corresponding to a signal output and comprising apparatus for processing electrical signals, the processing including adjustments to the electrical signals by use of the control elements connected to the output module;
   means connecting one or more of said input modules to a single said output module;
   means forming a part of a first module of said pluralities of modules for storing a first plurality of control element positions, said first plurality of positions comprising a single setup position for control elements on said first module;
   means forming a part of said first module for storing a second plurality of control element positions, said second plurality of positions comprising a single setup position for control elements on said first module;
   means forming a part of said console for selectively retrieving said first or second plurality of control element positions; and
   means forming a part of said first module for displaying adjacent to control elements a comparison between the stored setup position and the present position thereof, whereby the control elements may be adjusted to the setup positions.

2. A mixing console according to claim 1 wherein said means for storing said first and second pluralities of positions comprises:
   means for encoding the positions of the control elements of said first module in digital voltage signals; and
   means connected to said digital encoding means for recording the digital voltage signals associated with the control elements.

3. A mixing console according to claim 2 wherein said digital encoding means comprises:
   means for encoding the positions of the control elements connected to said first module in analog voltage signals; and
   means for converting the analog voltage signals associated with the control elements to digital voltage signals.

4. A mixing console according to claim 3 wherein said storing, retrieving, and displaying means are controlled by a microprocessor.

5. A mixing console according to claim 3 or 6 further comprising means for generating a plurality of addresses, each address corresponding to a single control element on said first module, said addressing means counting continuously through each address and thereby providing means for time multiplexing said storing, retrieving, and displaying means.

6. A mixing console according to claim 5 further comprising means for storing and retrieving more than two setup positions for the control elements of said first module.

7. A mixing console according to claim 6 further comprising a battery-powered power supply to ensure retention of the recorded signals for the control elements during loss of power and during transport of said mixing console.

8. A mixing console according to claim 6 wherein said analog encoding means comprising at least one multiple-wiper potentiometer and at least one multiple-pole switch arranged to provide an analog voltage indicative of the position of the control element.

9. A mixing console according to claim 6, wherein said converting means comprises an analog multiplexer which selects from among the analog voltage signals according to the address from said address generating means; and an analog-to-digital converter.

10. A mixing console according to claim 6 wherein said recording means comprises at least one random access memory.

11. A mixing console according to claim 6 wherein said displaying means comprises means for generating two output signals, said first output signal being active when the magnitude of the recorded signal for a control element exceeds the magnitude of the present signal from the control element, said second output signal being active when the magnitude of the present signal from the control element exceeds the magnitude of the recorded signal for the control element, and both said output signals being inactive when the magnitudes of the recorded signal and the present signal are substantially equivalent.

12. A mixing console according to claim 11, wherein said displaying means further comprises a pair of light-emitting diodes adjacent to each control element, said first diode of each said pair connected to said first output signal and said second diode of each said pair being connected to said second output signal.

13. A mixing console according to claim 12 wherein said second diode emits a different color light than said first diode.

14. A portable audio mixing console, comprising:
   a plurality of input modules, including a plurality of control elements;
   a plurality of output modules, including a plurality of control elements;
   means forming a part of said console for storing a first plurality of control element positions, said first plurality of positions comprising a single setup position for control elements on a first module of said pluralities of modules;
   means forming a part of said console for storing a second plurality of control element positions, said second plurality of positions comprising a single setup position for control elements on said first module;

means forming a part of said console for selectively retrieving said first or second plurality of stored control element positions; and means for displaying adjacent to control elements a comparison between the stored setup position and the present position thereof, whereby the control elements may be adjusted to the setup position.

15. A mixing console according to claim 14, wherein said retrieving means includes a switch means for selecting between said first and second pluralities of stored positions.

16. A mixing console according to claim 15, wherein the control elements for which positions may be stored by said storing means includes fader and equalizer controls.

17. A mixing console according to claim 16, wherein the control elements for which positions may be recorded further include pad and variable pad controls.

18. A method for setting up a portable audio mixing console, comprising the steps of:
    manually adjusting control elements on the mixing console to first setup positions;
    storing a single setup position for the control elements;
    providing indicating means adjacent to the control elements;
    selectively recalling the first setup positions from storage;
    comparing the first setup positions with the present positions of the control elements;
    indicating the result of said comparing step on the indicating means; and
    manually adjusting the control elements to the first setup positions.

19. A method according to claim 18 further comprising:
    after said storing the first setup positions, manually adjusting control elements on the mixing console to second setup positions;
    storing a single setup position for the control elements;
    after said last step of adjusting the control elements, selectively recalling the second setup positions from storage;
    indicating the second setup positions on the indicating means; and
    manually adjusting the control elements to the second setup positions.

* * * * *